United States Patent [19]
Ishii

[11] Patent Number: 5,243,209
[45] Date of Patent: Sep. 7, 1993

[54] SEMICONDUCTOR MEMORY DEVICE INCLUDING JUNCTION FIELD EFFECT TRANSISTOR AND CAPACITOR AND METHOD OF MANUFACTURING THE SAME

[75] Inventor: Tatsuya Ishii, Hyogo, Japan

[73] Assignee: Mitsubishi Denki Kabushiki Kaisha, Tokyo, Japan

[21] Appl. No.: 788,396

[22] Filed: Nov. 6, 1991

[30] Foreign Application Priority Data

Nov. 22, 1990 [JP] Japan .................. 2-318753

[51] Int. Cl.$^5$ .................... H01L 29/80; H01L 21/70
[52] U.S. Cl. .................... 257/263; 257/266; 257/296; 257/306; 257/390; 437/59; 437/28; 437/228; 437/911; 437/919
[58] Field of Search .............. 257/263, 266, 296, 306, 257/390; 437/59, 78, 228, 911, 919

[56] References Cited

U.S. PATENT DOCUMENTS 4,417,325 11/1983 Harari ................ 257/263
4,423,490 12/1983 Roesner .
4,434,433 2/1984 Nishizawa .......... 257/306

OTHER PUBLICATIONS

"A Reliable 1-Mbit DRAM with a Multiple-Bit-Test Mode", by Masaki Kumanoya et al., IEEE Journal of Solid State Circuits, vol. SC-20, No. 5, Oct. 1985, pp. 909-913.
"A Trench Transistor Cross-Point Dram Cell", by W. F. Richardson et al., IEDM Technical Digest, Dec. 1-4, 1985, pp. 714-717.

*Primary Examiner*—Edward Wojciechowicz
*Attorney, Agent, or Firm*—Lowe, Price, LeBlanc & Becker

[57] ABSTRACT

A dynamic random access memory includes a memory cell including a junction field effect transistor and a capacitor. A first conductivity-type semiconductor layer is formed on a main surface of a semiconductor substrate. The semiconductor layer includes a columnar part extending from the main surface of the semiconductor substrate and having a top surface and a sidewall surface. The junction field effect transistor is formed in the columnar part, and the capacitor is formed on the top surface of the columnar part. The junction field effect transistor includes a second conductivity-type impurity region and a gate electrode. The second conductivity-type impurity region is formed on the sidewall surface of the columnar part. The gate electrode is formed to surround the sidewall surface of the columnar part to be electrically in contact with the second conductivity-type impurity, region. The capacitor includes a storage node, a dielectric film, and a cell plate electrode. The storage node is formed to be electrically in contact with the top surface of the columnar part. The dielectric film is formed on the storage node. The cell plate electrode is formed on the dielectric film. It is possible to attain higher degree of integration and higher density of the memory cell without causing variation in the characteristics of the transistor included in the memory cell and without decreasing the noise margin of operation of the semiconductor substrate.

14 Claims, 14 Drawing Sheets

SEMICONDUCTOR MEMORY DEVICE INCLUDING JUNCTION FIELD EFFECT TRANSISTOR AND CAPACITOR AND METHOD OF MANUFACTURING THE SAME

BACKGROUND OF THE INVENTION

1. Field of the Invention

The present invention relates to semiconductor memory devices and a method of manufacturing the same, and particularly to a semiconductor memory device including a junction field effect transistor and a capacitor, for example, a dynamic random access memory and a method of manufacturing the same.

2. Description of the Background Art

In recent years, the demand for semiconductor memory device has rapidly increased in accordance with the remarkable spread of information processing equipment such as computers. Functionally, a semiconductor memory device having a large-scale storage capacity and being capable of high-speed operation is demanded. Under such a background, technical development concerned with large scale integration, high response rate, or high reliability of semiconductor memory devices is in progress.

Semiconductor memory devices include those allowing random input thereto/output therefrom of storage information, which include DRAMs (Dynamic Random Access Memories). A DRAM generally includes a memory cell array which is a storage region storing a plurality of pieces of storage information and peripheral circuits necessary for input thereto and output therefrom from and to the outside.

FIG. 13 is a block diagram illustrating a general structure of a DRAM. Referring to FIG. 13, a DRAM 50 includes a memory cell array 51, a row and column address buffer 52, a row decoder 53 and a column decoder 54, a sense refresh amplifier 55, a data in buffer 56 and a data out buffer 57, and a clock generator 58. Memory cell array 51 is for storing data signals of storage information. Row and column address buffer 52 is for receiving from the outside an address signal $A_0$–$A_9$ for selecting a memory cell which constitutes an unit storage circuit. Row decoder 53 and column decoder 54 are for designating a memory cell by decoding the address signal. Sense refresh amplifier 55 is for amplifying and reading the signal stored in the designated memory cell. Data in buffer 56 and data out buffer 57 are for data input/output. Clock generator 58 generates a clock signal to be a control signal to each unit.

A plurality of memory cells for storing unit storage information are arranged in a matrix manner in memory cell array 51 occupying a large area on a semiconductor chip. FIG. 14 is an equivalent circuit diagram of four bits of memory cells included in memory cell array 51. Memory cell array 51 includes a plurality of word lines WL extending parallel in the row direction and a plurality of bit line pairs BL, $\overline{BL}$ extending parallel in the column direction. Memory cells M are formed in the vicinity of crossings of word lines WL and bit lines BL, $\overline{BL}$. The illustrated memory cell M includes one MOS (Metal Oxide Semiconductor) transistor Tr and one capacitor C. Specifically, each memory cell is illustrated as a so-called one transistor-one capacitor type memory cell. The structure of a memory cell of this type is simple, so that it can enhance the degree of integration of memory cell arrays and is widely used in DRAMs of large capacity. The structure in which a pair of bit lines BL, $\overline{BL}$ are arranged parallel in regard to a sense amplifier as illustrated in FIG. 14 is referred to as a folded bit line type.

Referring to FIG. 13, data is stored in memory cell array 51 of N (=n×m) bits. Address information concerned with the memory cell to/from which reading/writing is going to be performed is retained in row and column address buffer 52, and row decoder 53 selects a particular word line (selects one word line from n word lines) to couple m bits of memory cells through bit lines to sense refresh amplifier 55. Then, column decoder 54 selects a particular bit line (selects one bit line from m bit lines) to couple the sense refresh amplifier of one of them to an input/output circuit, and reading or writing is performed in accordance with a command from a control circuit.

Referring to FIG. 14, a gate electrode of a MOS transistor Tr is connected to a word line WL, a source/drain electrode is connected to an electrode of a capacitor C, and another source/drain electrode is connected to a bit line BL. On data writing, a prescribed voltage is applied to word line WL to render MOS transistor Tr conductive, so that an electric charge applied to bit line BL is stored in capacitor C. On data reading, a prescribed voltage is applied to word line WL to render MOS transistor Tr conductive, so that an electric charge stored in capacitor C is withdrawn through bit line BL.

In recent years, advancement of semiconductor memory devices is remarkable, and miniaturization of each of semiconductor device patterns formed in them has rapidly progressed as the degree of integration and density of them have become higher. There is a strong demand for a semiconductor memory device of a high speed, a small size, and a large capacity. In order to realize these requests, it has become indispensable to further miniaturize the pattern of each semiconductor element. Particularly, the above-described memory cell in a DRAM is a representative. It is necessary to reduce the occupied area of a semiconductor substrate by not only reducing the size of each single element such as a transistor and a capacitor but also reducing the size of a memory cell constituted with them. Various types of memory cell structures are being actively developed in order to reduce the occupied area in a memory cell region.

In a conventional 1-megabit DRAM, a capacitor and a transistor constituting a memory cell were arranged in a planar part of a main surface of a semiconductor substrate. However, it was necessary to reduce the occupied area of a semiconductor substrate for one memory cell in order to enhance the degree of integration from 1 megabit to 4 megabits, 16 megabits, and 64 megabits. Reduction of the area of a capacitor was limited because the capacitance value of the capacitor must be more than a certain value. The capacitance value must be at least approximately 40fF in order to prevent malfunctions of circuits, caused by generation of electron-hole pairs in a semiconductor substrate caused by alpha particles included in a package or the like of a DRAM. i.e. soft errors. On the other hand, in a channel region in an insulated gate field effect transistor, a short channel effect, which is an effect that reduction in a threshold voltage and increase in a change in the threshold voltage for the channel length are caused in accordance with reduction in the channel length, and a narrow channel effect, which is an effect that increase in the threshold voltage is caused by extension of a depletion layer under the channel region in the direction of the width in accordance with reduction in the channel width, are caused. Furthermore, a problem concerned with reliability is caused, which is of the characteristics of a transistor being degraded in a long period of time by hot carriers generated by impact ionization in the pinch-off region at the end of a drain region. It was difficult to make the channel length and the channel width not more than 1 μm because of such problems in the channel region.

A one transistor-one capacitor dynamic memory cell in which a vertical-type transistor is formed in the sidewall part of a trench for a capacitor is disclosed in IEDM Technical Digest p. 714–717, Dec. 1-4, 1985, "A TRENCH TRANSISTOR CROSS-POINT DRAM CELL" in order to avoid occurrence of the problems as described above and attain higher density and higher degree of integration. According to the literature, a structure is disclosed, which is most advantageous in attempting reduction of the occupied area because all the memory cells in a DRAM are buried in trenches. FIG. 15 is a plan view illustrating such a DRAM, and FIG. 16 is a partial sectional view illustrating a cross sectional structure along line XVI—XVI in FIG. 15.

Referring to FIG. 15, n+impurity regions 103 which serve as a plurality of bit lines and gate electrodes 105 which serve as a plurality of word lines are arranged crossing each other at right angles. Trenches 101 are formed at crossings of the bit lines and the word lines. Memory cells M are formed in trenches 101, respectively. Referring to FIG. 16, memory cells M isolated by an isolating oxide film 110 are formed on a main surface of a p-type silicon substrate 102. Each of the memory cells M includes a n channel MOS transistor and a capacitor. The n channel MOS transistor includes n+impurity regions 103, 104 constituting drain/source regions, a channel region 106 provided between them, and a gate electrode 105 formed on channel region 106 with a gate oxide film 105a interposed therebetween. Channel region 106 is on the periphery of gate oxide film 105a formed on the main surface of silicon substrate 102 and exists along the sidewall part of the trench. The capacitor includes a capacitor electrode 120 formed to be connected to n+impurity region 104 included in the n channel MOS transistor, a capacitor oxide film 130, and a p-type silicon substrate 102. Capacitor electrode 120 includes a polycrystalline silicon layer buried in the trench formed in p-type silicon substrate 102. n+impurity region 104 is provided in a ring shape on the periphery of capacitor electrode 120. Gate electrode 105 included in the n channel MOS transistor includes a n+polycrystalline silicon layer and serves as a word line.

As described, in the memory cell illustrated in FIG. 16, a vertical n channel MOS transistor is formed in the sidewall part of a trench provided for a capacitor. In other words, a capacitor and an insulated gate type field effect transistor are arranged in a trench, lined in a vertical direction. Accordingly, most of the capacitor region is arranged on the sidewall of a trench, and the whole of a channel region of the insulated gate field effect transistor is arranged only on the sidewall of the trench. A less area of the planar part of the main surface of the substrate is occupied by the n channel MOS transistor. As a result, enhancement of the degree of integration of the memory cells is attained. Maintenance of the performance of the transistor is attained by forming the channel region in the sidewall part of the trench, for example, without miniaturizing the transistor itself.

In the memory cell illustrated in FIG. 16, the area of the capacitor and the channel length of the insulated gate field effect transistor can be extended by forming deep the trench. Furthermore, capacitor electrode 120 serving as an information charge storing region is arranged inside the trench, so that it is less likely affected by electron-hole pairs, which are generated in the semiconductor substrate by alpha particles, and is strong against soft errors. Therefore, the capacitance value of the capacitor may be lower than that in the case where information charge storing region is arranged in the semiconductor substrate.

According to the structure of the memory cell illustrated in FIG. 16, the insulated gate field effect transistor is formed in the sidewall part of the trench. Therefore, it is very difficult to control the length of the gate in a manufacturing process. As a result, there is a possibility that the length of the gate in each memory cell varies largely. In the structure of the memory cell illustrated in FIG. 16, the length of the gate of the insulated gate field effect transistor varies in accordance with the depth of etching of p-type silicon substrate 102, the amount of etching of the polycrystalline silicon layer on formation of capacitor electrode 120, and so on. There was a problem that if the length of the gate varies largely as described above, the current driving capability of the insulated gate field effect transistor varies, and, as a result, the switching rate varies largely.

In addition, the structure of the memory cell illustrated in FIG. 16 is a so-called substrate/cell plate-type memory cell in which p-type silicon substrate 102 serves as a cell plate electrode. Therefore, in this structure, the noise of p-type silicon substrate 102 directly causes fluctuation of the potential of the cell plate, and the noise margin of the memory cell is reduced. Specifically, fluctuation of the difference between the potentials of storage node and the cell plate is reduced by the effect of the noise, so that there is a danger that the amount of charge stored in the capacitor is reduced. Furthermore, in the substrate/cell plate-type memory cell, it is not possible to apply a potential different from a prescribed potential of the substrate to the cell plate, so that it is not possible to adjust the potential of the cell plate to reduce the electric field strength on capacitor dielectric film 130.

It is reported in M. Kumanoya et al. IEEE Journal of Solid-State Circuits, vol. SC-20, No. 5, pp. 909–913, Oct. 1985 "A Reliable 1-Mbit DRAM with a Multi-Bit-Test Mode" that the electric field strength on the capacitor dielectric film is reduced by providing a potential Vcc/2 (2V), which is different from the substrate potential Vss (0V), to the cell plate (Vcc indicates the supply voltage, and the signal potentials of a high or "H" level and a low or "L" level are 4V and 0V, respectively), so that reliability of the memory cell is enhanced. Specifically, the capacitor dielectric film must withstand the electric field strength of 4V when the substrate potential Vss is provided to the cell plate, while it must withstand the electric field strength of 2V when Vcc/2 is provided to the cell plate. Accordingly, when the substrate potential is provided to the cell plate, the capacitor dielectric film must have a higher thickness, and the thick capacitor dielectric film is not preferred for attaining higher degree of integration of the DRAM.

In the structure of the memory cell illustrated in FIG. 16, the potential of the cell plate electrode becomes a negative potential which is applied to p-type silicon substrate 102, so that there was a problem that it is not possible to apply the above-described method in which the voltage applied to the capacitor dielectric film is Vcc/2.

On the other hand, a DRAM employing a junction field effect transistor is disclosed in U.S. Pat. No. 4,423,490. The U.S. Patent does not disclose a structure of a DRAM comprising a junction field effect transistor for attaining higher degree of integration and higher density.

SUMMARY OF THE INVENTION

An object of the present invention is to attain higher degree of integration and higher density of a memory cell without generating variation in the characteristics of a transistor comprised in each memory cell.

Another object of the present invention is to attain higher degree of integration and higher density of a memory cell having a structure in which a cell plate electrode and a semiconductor substrate are independent.

Still another object of the present invention is to form a miniaturized memory cell having high reliability.

A further object of the present invention is to form a memory cell of higher degree of integration and higher density in a dynamic random access memory.

Another object of the present invention is to manufacture a semiconductor memory device including a memory cell of higher degree of integration and higher density without generating variation in the characteristics of the transistor included in each memory cell.

Still another object of the present invention is to manufacture a semiconductor memory device having a structure in which a cell plate electrode and a semiconductor substrate are independent and including a memory cell of higher degree of integration and higher density.

A further object of the present invention is to manufacture a semiconductor memory device including a miniaturized memory cell with high reliability.

Another object of the present invention is to manufacture a dynamic random access memory including a memory cell of higher degree of integration and higher density.

A semiconductor memory device according to an aspect of the present invention includes a semiconductor substrate, a semiconductor layer of a first conductivity-type, a junction field effect transistor, and a capacitor. The semiconductor substrate has a main surface. The semiconductor layer of the first conductivity-type includes a columnar part extending from a main surface of the semiconductor substrate and having a top surface and a sidewall surface and is formed on the main surface of the semiconductor substrate. The junction field effect transistor is formed in the columnar part. The capacitor is formed on the top surface of the columnar part. The junction field effect transistor includes a conductive layer and a gate electrode. The conductive layer is formed on the sidewall surface of the columnar part. The gate electrode is formed to be electrically in contact with the conductive layer. The capacitor includes a first electrode, a dielectric film, and a second electrode. The first electrode is formed to be electrically in contact with the top surface of the columnar part. The dielectric film is formed on the first electrode. The second electrode is formed on the dielectric film.

According to a method of manufacturing a semiconductor memory device in accordance with another aspect of the present invention, first, a semiconductor layer of a first conductivity-type, which includes a columnar part extending from a main surface of a semiconductor substrate and having a top surface and a sidewall surface, is formed on the main surface of the semiconductor substrate. A conductive layer is formed on the sidewall surface of the columnar part. A gate electrode is formed to be electrically in contact with the conductive layer. A first electrode is formed to be electrically in contact with the top surface of the columnar part. A dielectric film is formed on the first electrode. A second electrode is formed on the dielectric film.

According to the present invention, a columnar part of a semiconductor layer of a first conductivity-type is formed to extend from a main surface of a semiconductor substrate. A junction field effect transistor is formed in the columnar part. Therefore, the length of the gate of the junction field effect transistor is determined in accordance with the length of the columnar part. The length of the gate may be easily controlled only by the depth of etching of the semiconductor layer of the first conductivity-type. Accordingly, variation in the characteristics of the transistor is suppressed. In addition, a gate electrode is formed along the sidewall surface of the columnar part of the semiconductor layer of the first conductivity-type. Therefore, a channel region is formed in a vertical direction, so that it is not possible that a field effect transistor having an extremely short channel length is implemented.

An effect of a hot carrier phenomenon in an insulated gate field effect transistor is that hot electrons are generated because of impact ionization in a pinch-off region (high electric field region) at the end of a drain region and trapped in an insulating film in an insulated gate, so that the characteristics of the transistor are degraded for a long period of time. In a junction field effect transistor according to the present invention, the hot carrier phenomenon is also generated when the transistor is turned from on to off, and from off to on, and hot electrons are generated. However, no insulating film is included in the junction field effect transistor, so that it does not happen that the characteristics of the transistor are degraded because of hot electrons trapped in an insulating film.

In addition, a first electrode connected to a top surface of a columnar part serves as an information charge storing region, and a second electrode connected to the first electrode with a dielectric film interposed therebetween serves as a cell plate electrode. Therefore, it is a structure in which the cell plate electrode is independent of the semiconductor substrate. As a result, the potential of the cell plate electrode is not affected by a noise of the semiconductor substrate. Accordingly, it is possible to avoid reduction in the noise margin of the memory cell.

It is a structure in which the cell plate electrode is independent of the semiconductor substrate, so that it is possible to apply a potential different from the substrate potential to the cell plate electrode. Therefore, it is possible to adjust the potential of the cell plate to reduce the electric field strength on the capacitor dielectric film. Accordingly, it is possible to enhance reliability of the memory cell.

Accordingly, it is possible to attain higher degree of integration and higher density of a memory cell with higher reliability without generating variation in the characteristics of the transistor in each memory cell and without having the potential of the cell plate electrode fluctuated by a noise in the semiconductor substrate.

According to a preferred embodiment of the semiconductor memory device of the present invention, the gate electrode is formed of polycrystalline silicon including an impurity of a second conductivity-type. The conductive layer includes an impurity region of a second conductivity-type formed on the sidewall surface of the columnar part.

According to a preferred embodiment of a semiconductor memory device of the present invention, a dynamic random access memory includes a semiconductor substrate having a main surface, a plurality of bit lines, a plurality of word lines, and a plurality of memory cells. The bit lines are formed on the main surface of the semiconductor substrate, electrically isolated from one another, and extend in a first direction. The word lines are formed on the bit lines and extend in a second direction crossing the first direction. Memory cells are arranged at crossings of the word lines and the bit lines. Bit lines have columnar parts each extending from the main surface of the semiconductor substrate and having a top surface and a sidewall surface at the crossings. Each of the memory cells includes a capacitor formed on the top surface of the columnar part and a junction field effect transistor formed in the columnar part.

According to a preferred method of manufacturing a semiconductor memory device of the present invention, the step of forming the semiconductor layer of the first conductivity-type includes the steps of forming a semiconductor layer of a first conductivity-type on the whole of the main surface of the semiconductor substrate and forming a columnar part of a convex shape by selectively removing the semiconductor layer. In addition, the step of forming a conductive layer includes the steps of forming an impurity region of a second conductivity-type which includes forming a polycrystalline silicon layer including an impurity region of a second conductivity-type to cover the sidewall of the columnar part and doping an impurity of the second conductivity-type from the polycrystalline silicon layer to the sidewall of the columnar part.

As described above, according to the present invention, the junction field effect transistor is arranged in the columnar part formed on the semiconductor substrate, so that the length of the gate is controlled by the depth of etching of the semiconductor layer, and variation in the characteristics of the transistor is suppressed. In addition, a junction field effect transistor is employed, so that the problem of degradation in the characteristics of the transistor caused by hot carriers is solved.

Furthermore, the cell plate electrode is arranged independent of the semiconductor substrate, so that fluctuation in the potential of the cell plate electrode caused by a noise of the semiconductor substrate is canceled, and it is possible to avoid reduction in the noise margin of the memory cell. It is possible to apply a potential different from the substrate potential to the cell plate electrode, so that it is possible to adjust the potential of the cell plate to reduce the electric field strength applied on the capacitor dielectric film to enhance reliability of the memory cell.

Accordingly, it is possible to attain higher degree of integration and higher density of a memory cell with enhanced reliability without generating variation in the characteristics of the transistor and reducing the noise margin of the memory cell.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
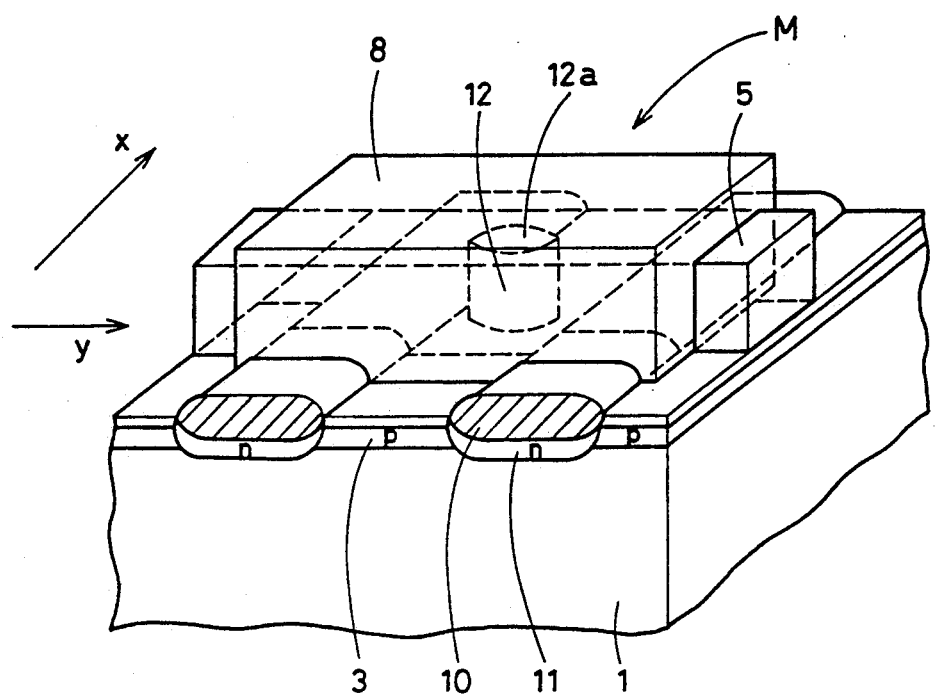
FIG. 1 is a perspective view of a memory cell according to an embodiment of the present invention.

Referring to FIG. 1, a bit line 3 including a p-type monocrystalline silicon layer (an epitaxial layer) is formed on a monocrystalline silicon substrate 1 to extend in the direction of the x axis. A columnar layer 12 of a convex columnar shape is formed on the surface of bit line 3. Thick isolation insulating films 10 are formed to extend in the direction of the x axis with the convex columnar layer 12 between them. Isolation insulating film 10 includes a relatively thick silicon oxide film formed by thermal oxidation. A channel cut layer (inversion preventing region) 11 including an n-type impurity diffused region is formed beneath isolation insulating film 10. Channel cut layer 11 is formed to reach the surface of monocrystalline silicon substrate 1. Word line 5 is arranged to surround the sidewall of columnar layer 12 of a convex columnar shape and to extend in the direction of the y axis. A memory cell M is arranged in the part of columnar layer 12 at the crossing of word line 5 and bit line 3. Only a storage node 8 formed to be connected to the upper surface 12a of columnar layer 12 is illustrated in FIG. 1.

Figure 2:
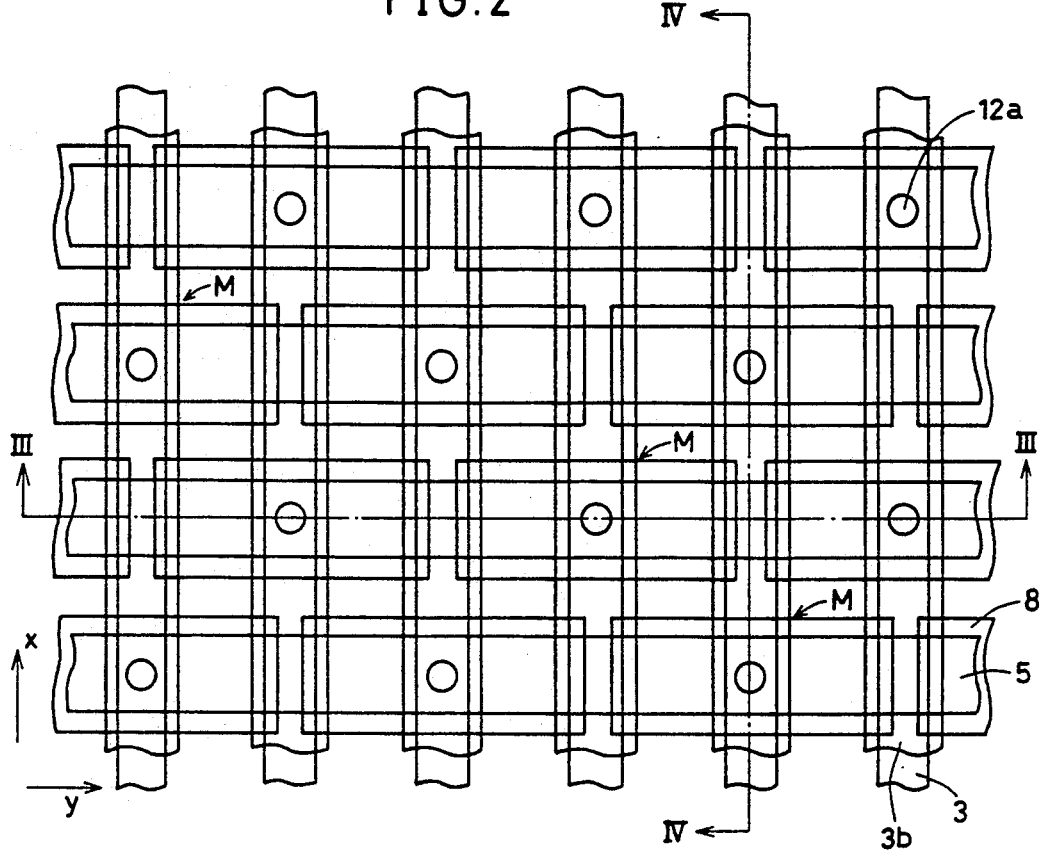
FIG. 2 is a plan view illustrating a planar arrangement according to a folded bit line type of a memory cell of the present invention.
Figure 3:
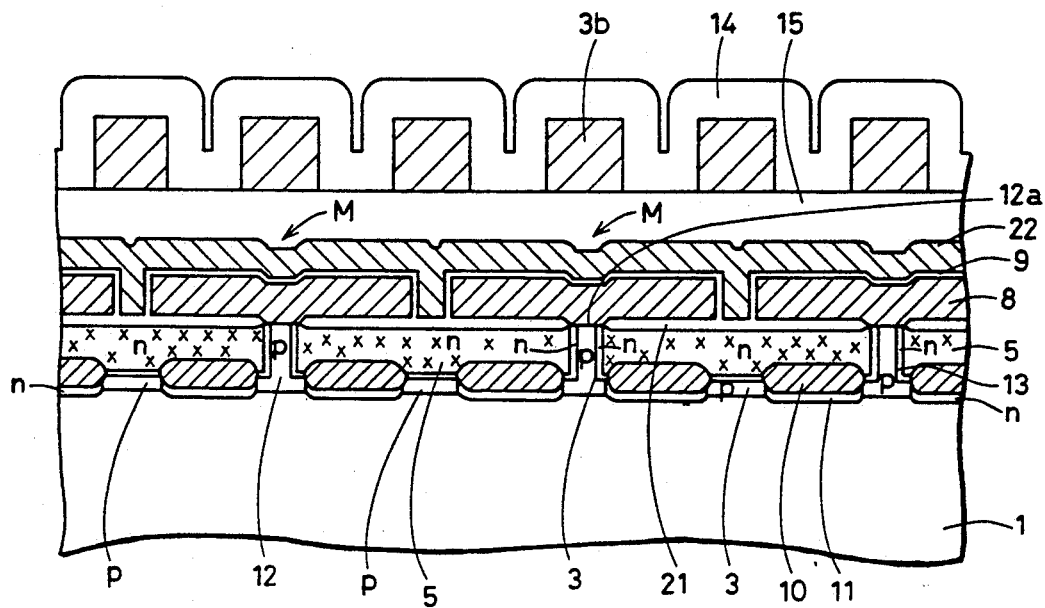
FIG. 3 is a sectional view illustrating a sectional structure taken along line III—III in FIG. 2.
Figure 4:
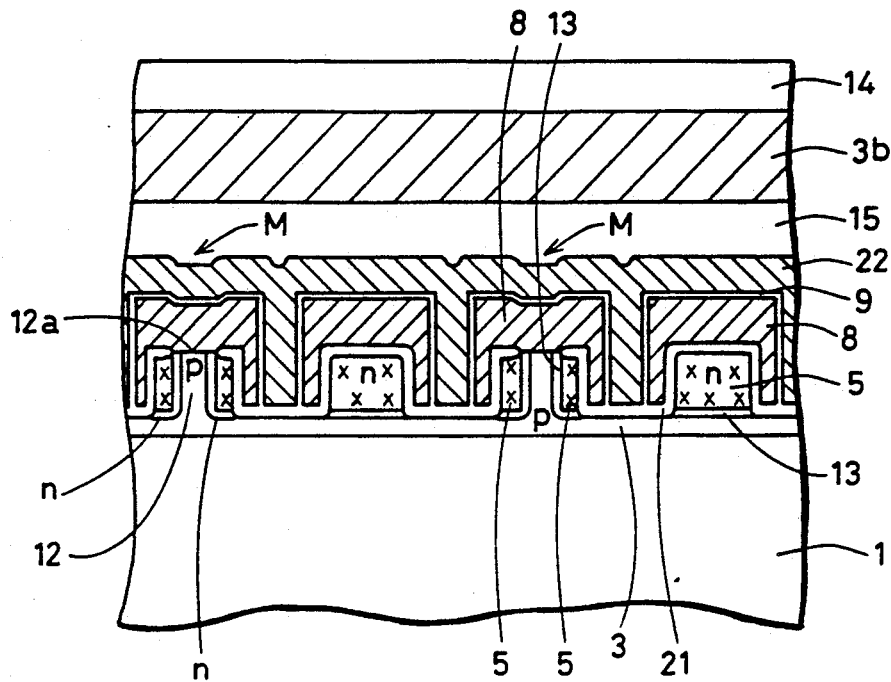
FIG. 4 is a sectional view illustrating a sectional structure taken along line IV—IV in FIG. 2.

Referring to FIGS. 2, 3, and 4, a gate diffused layer 13 including an n-type impurity diffused region is formed in the p-type monocrystalline silicon layer in the sidewall part of columnar layer 12. A word line 5 including an n-type polycrystalline silicon layer is formed to surround the sidewall part of columnar layer 12 and to be electrically in contact with gate diffused layer 13. A storage node 8 including polycrystalline silicon is formed to be electrically in contact with upper surface 12a of columnar layer 12. A capacitor dielectric film 9 including a thin silicon oxide film is formed on the surface of storage node 8. A cell plate electrode 22 including polycrystalline silicon is formed to be connected through capacitor dielectric film 9 to storage node 8. An interlayer insulating film 15 including BPSG having a satisfactorily flat surface is formed on cell plate electrode 22. Bit lines 3b including aluminum interconnection are formed on interlayer insulating film 15 in positions corresponding to bit lines 3 each including a p-type monocrystalline silicon layer. Bit line 3b is connected in parallel with bit line 3 in the part of a peripheral circuit, although it is not shown. A surface protecting film 14 including a silicon nitride film is formed on bit lines 3b.

Figure 6:
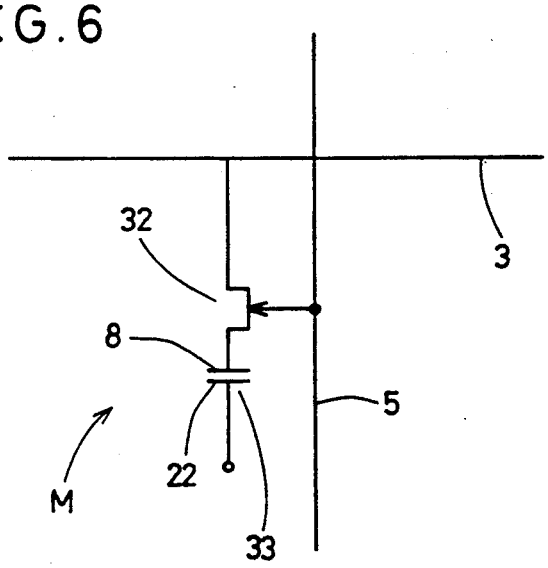
FIG. 6 is an equivalent circuit diagram of a memory cell according to the present invention.

Referring to FIG. 6, a memory cell M includes a junction field effect transistor 32 and a capacitor 33. Capacitor 33 includes a storage node 8 and a cell plate electrode 22. Storage node 8 is connected to an electrode of junction field effect transistor 32. A gate electrode of junction field effect transistor 32 is connected to a word line 5. Another electrode of junction field effect transistor 32 is connected to a bit line 3.

Figure 5:
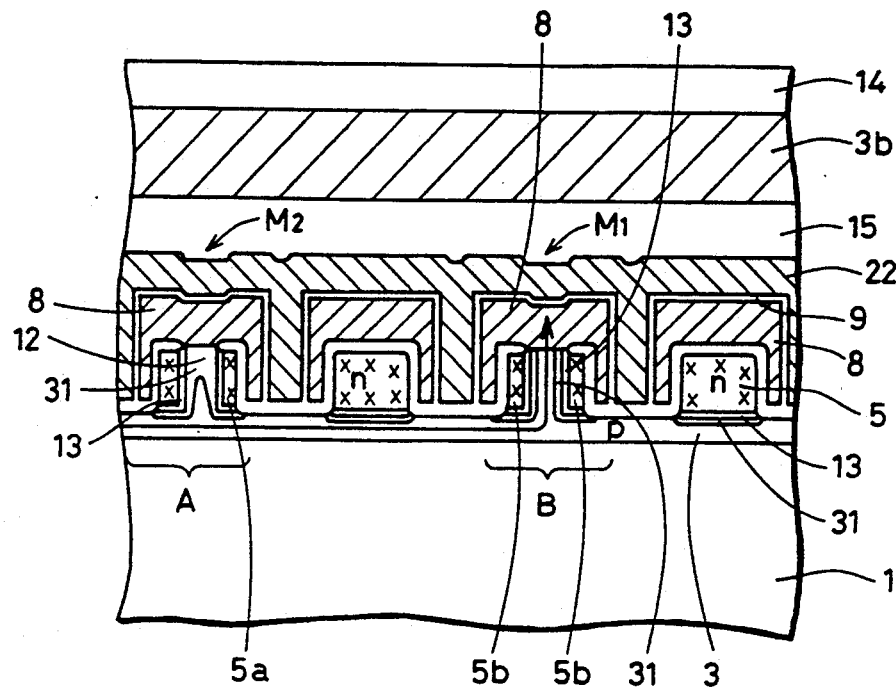
FIG. 5 is a sectional view corresponding to FIG. 4 and illustrating operation of a memory cell according to the present invention.

Now, referring to FIG. 5, it is assumed that a memory cell M1 is selected. A voltage of 0V is applied to a word line 5b, and a voltage of 0V is applied to bit line 3. A voltage of 5V is applied to a word line 5a. Then, a transistor B is in ON state, and a transistor A is in OFF state. Specifically, in transistor A, a depletion layer 31 is fully extended in columnar layer 12 to close the channel. Therefore, it is not possible to exchange electric charges between storage node 8 and bit line 3. On the other hand, in transistor B in ON state, extension of a depletion layer 31 is little, and a channel is formed. Therefore, electric charges can be moved between storage node 8 and bit line 3 through columnar layer 12. Electric charges are moved through bit line 3, to which a voltage of 0V is applied, in the direction indicated by an arrow. Consequently, a signal potential of "High" level is held in storage node 8 in memory cell M1.

A voltage of 0V is applied to word line 5b, and a voltage of −5V is applied to bit line 3. Then, a voltage of 5V is applied to word line 5a. In this case, transistor B is in ON state, and transistor A is in OFF state. Electric charges are moved through bit line 3 in the direction indicated by an arrow, so that a signal potential of "Low" level is held in storage node 8.

On the occasion of reading, transistor B is rendered conductive by applying a voltage of 0V to word line 5b, so that the electric charges stored in storage node 8 are withdrawn through bit line 3.

As described above, switching is carried out using a junction field effect transistor so that data is written and read.

Next, a method of manufacturing a memory cell of a DRAM according to the present invention will be described.

Figure 8A:
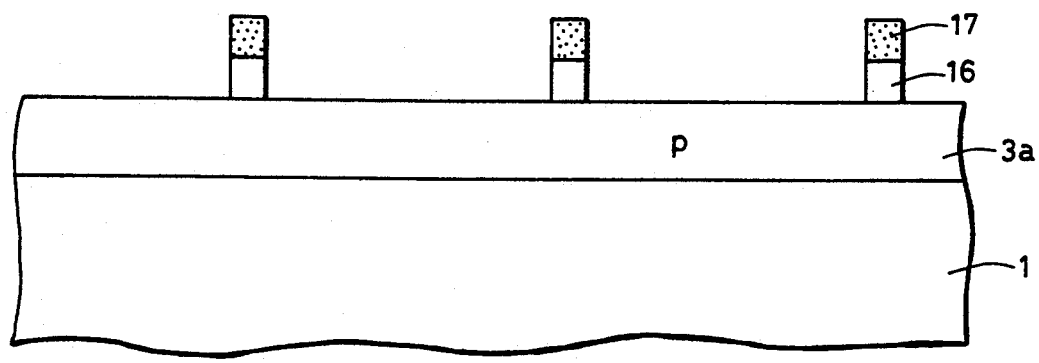
FIGS. 8A, 8B, 8C, 8D, 8E, 8F, 8G, 8H, 8I, 8J, and 8K are sectional views illustrating a method of manufacturing a memory cell according to the present invention in the order of the steps of manufacturing in accordance with the sectional structure illustrated in FIG. 3.

Referring to FIG. 8A, a monocrystalline silicon layer 3a including a p-type impurity is formed on a monocrystalline silicon substrate 1 by epitaxial growth. Then, a relatively thick silicon oxide film is formed on monocrystalline silicon layer 3a by a CVD method. Resist films 17 are formed spaced apart from each other on the silicon oxide film using a photolithography technique. The silicon oxide film is removed by using resist films 17 as a mask to form silicon oxide films 16 spaced apart from each other. The removal of the silicon oxide film is carried out by reactive ion etching (RIE) using $CHF_3$ gas and $O_2$ gas.

Figure 7A:
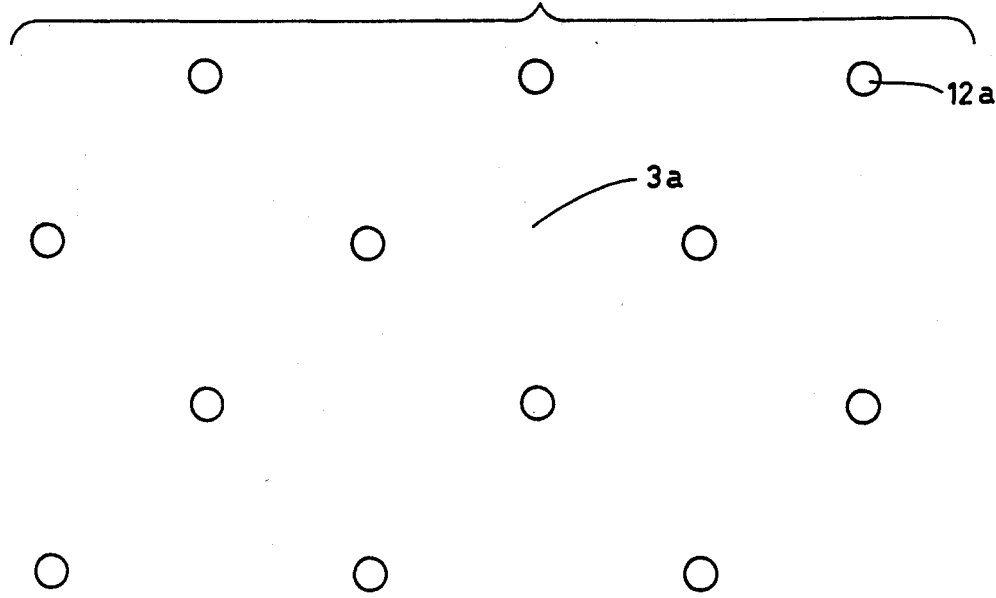
FIGS. 7A, 7B, 7C and 7D are plan views illustrating a method of manufacturing a memory cell according to the present invention in the order of the steps of manufacturing.
Figure 8B:
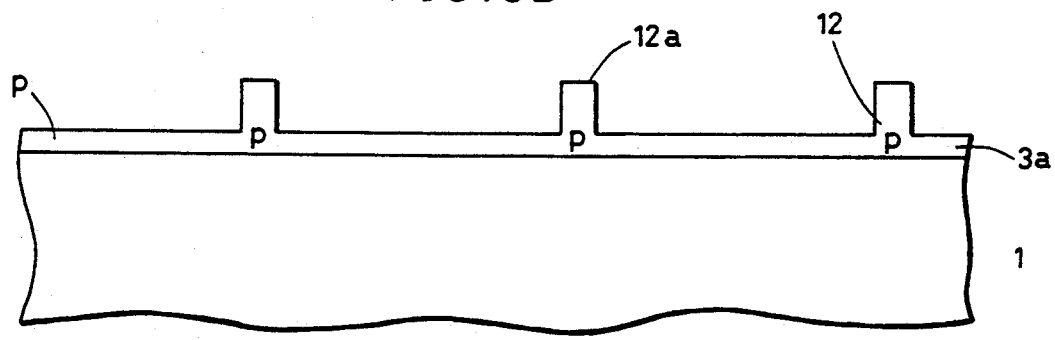

Referring to FIGS. 7A and 8B, resist films 17 are removed by using oxygen plasma. Then, p-type monocrystalline silicon layer 3a is selectively removed by reactive ion etching using gas containing $SiCl_4$ with silicon oxide films 16 as a mask. Trenches having a prescribed depth are formed in p-type monocrystalline silicon layer 3a. As a result, columnar layers 12 of a convex columnar shape are formed spaced apart from each other in monocrystalline silicon layer 3a. Columnar layer 12 has an upper surface 12a. A planar arrangement of columnar layers 12a is illustrated in FIG. 7A.

Figure 8C:
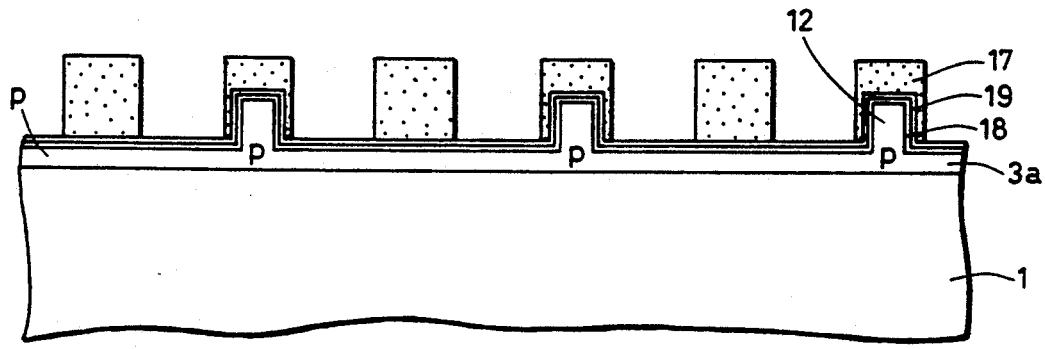

Referring to FIG. 8C, a relatively thin silicon oxide film 18 is formed by performing thermal oxidation processing on the whole surface. A relatively thin silicon nitride film 19 is formed on silicon oxide film 18 using a CVD method. Next, the surface of p-type monocrystalline silicon layer 3a except element isolating regions is covered with resist films 17 using a three-layer resist process. In other words, resist films 17 are formed only in bit line forming regions.

Figure 8D:
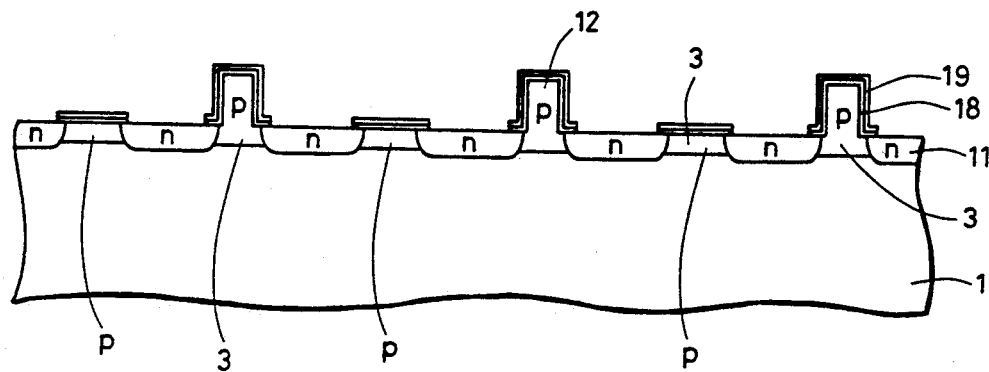

Referring to FIG. 8D, silicon nitride film 19 is selectively removed using plasma etching with $CF_4$ gas and $O_2$ gas. Silicon oxide film 18 is selectively removed by hydrofluoric acid processing. Then, resist films 17 are removed with oxygen plasma. Then, an n-type impurity is diffused to reach the surface of monocrystalline silicon substrate 1 using an ion implantation method with silicon nitride film 19 as a mask. Channel cut layers 11 are formed.

Figure 7B:
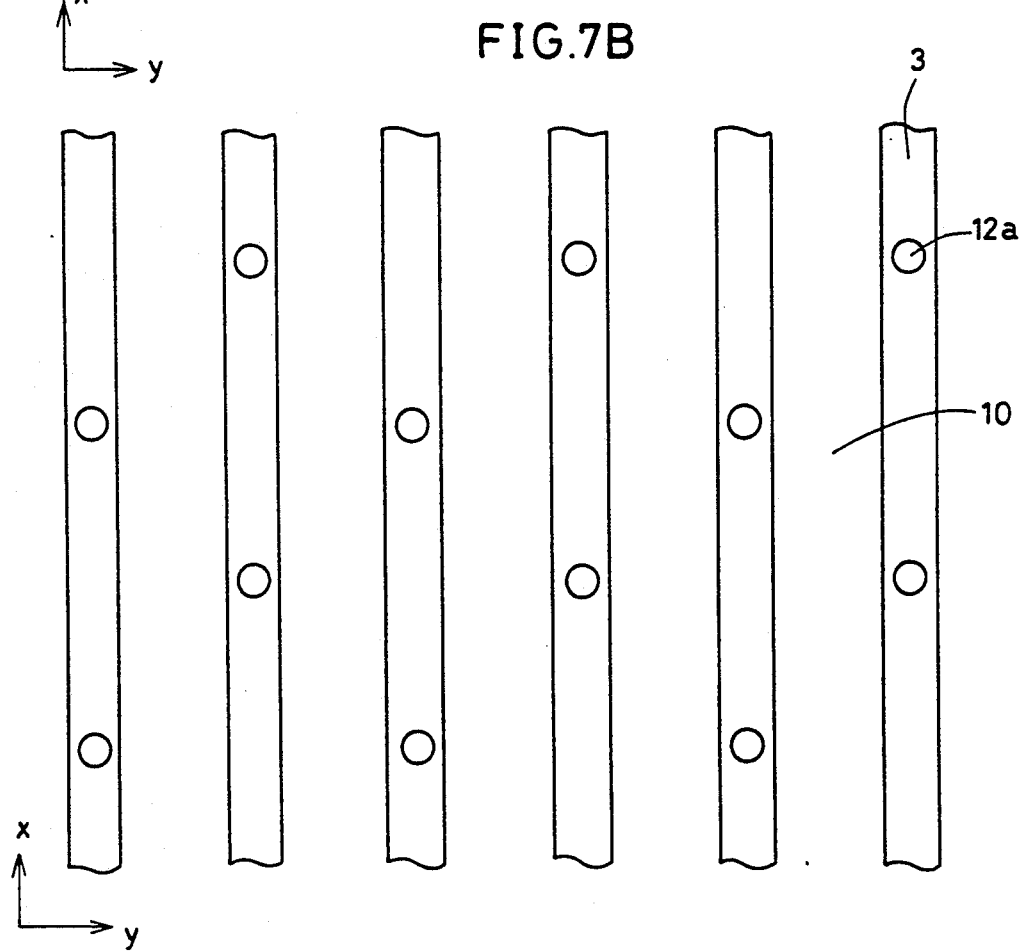
Figure 8E:
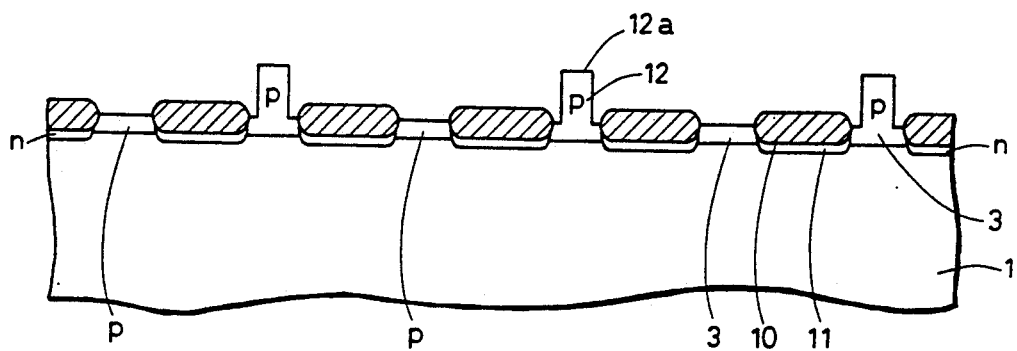

As illustrated in FIG. 8E, thermal oxidation processing is carried out using silicon nitride films 19 as a mask to form isolation insulating films 10 of so-called LOCOS (Local Oxidation of Silicon). Then, silicon nitride films 19 and silicon oxide films 18 are removed using the same method as described above. The planar arrangement at this time is illustrated in FIG. 7B.

Figure 8F:
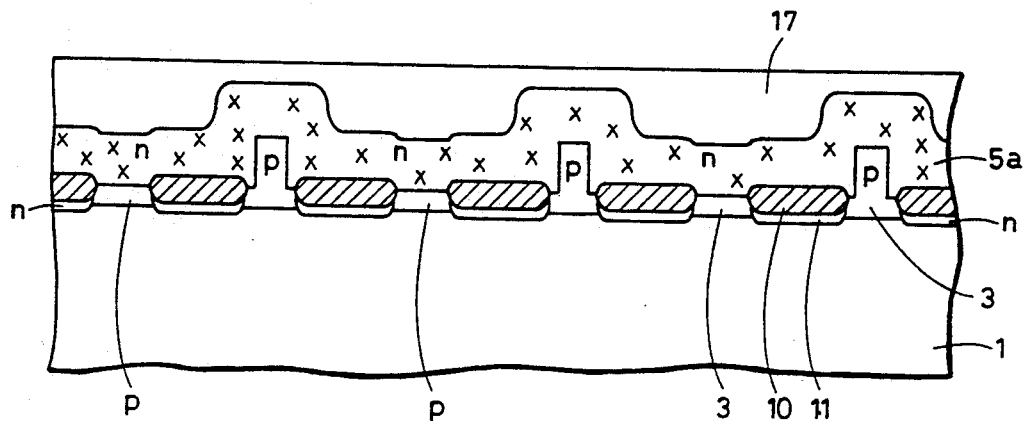

Next, referring to FIG. 8F, a polycrystalline silicon layer 5a including an n-type impurity is deposited on the whole surface. Then, a resist film 17 with a satisfactorily flat surface is applied on the whole surface.

Figure 7C:
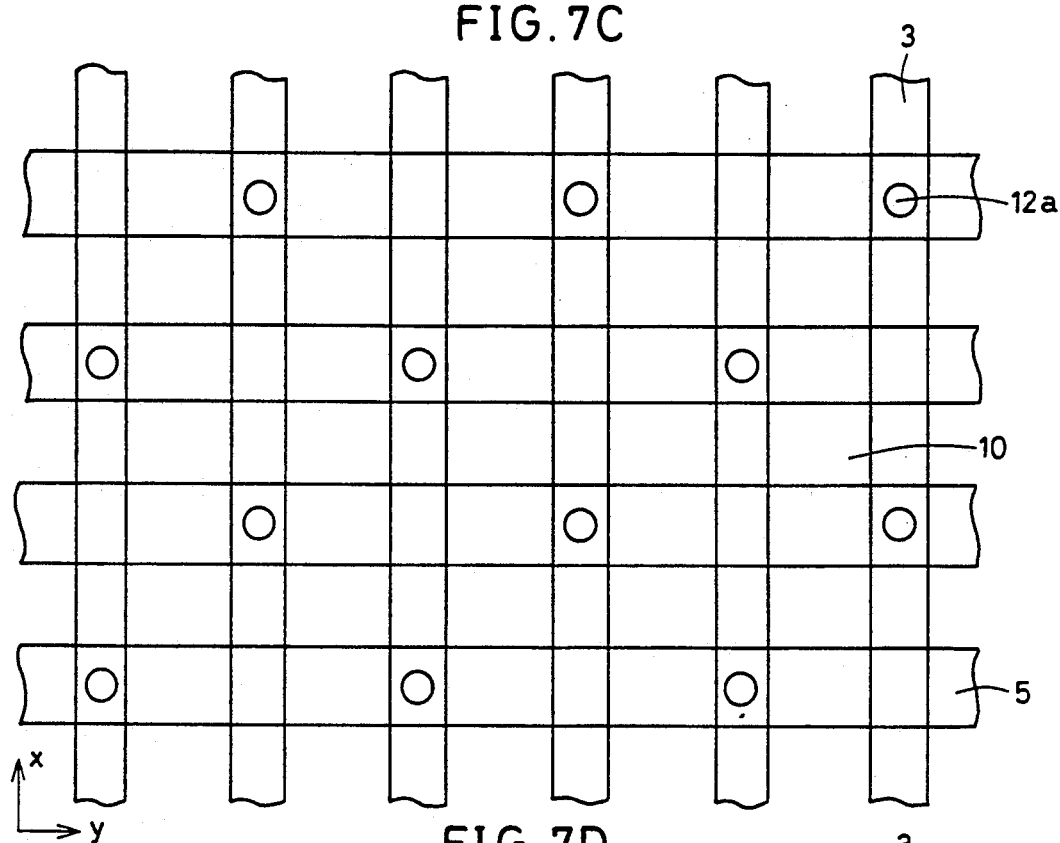
Figure 8G:
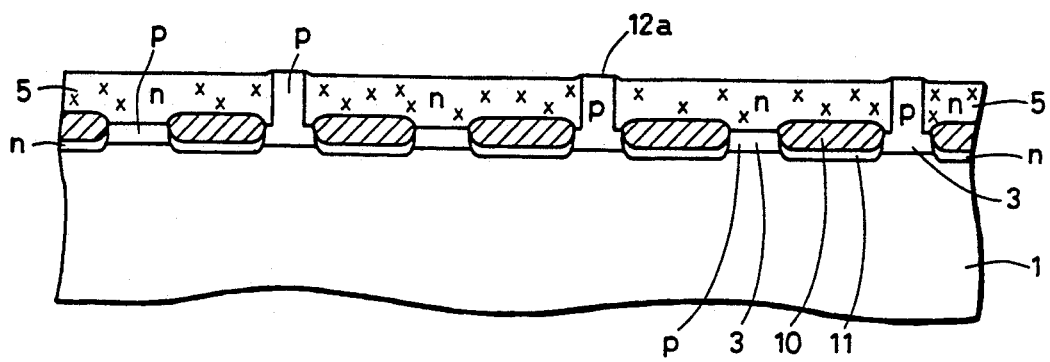

Referring to FIG. 8G, etch back processing is carried out to expose upper surfaces 12a of convex shapes. Polycrystalline silicon layer 5a is shaped in a pattern extending along the y axis as illustrated in FIG. 7C using a photolithography technique and an etching technique. Thus word lines 5 are formed.

Figure 8H:
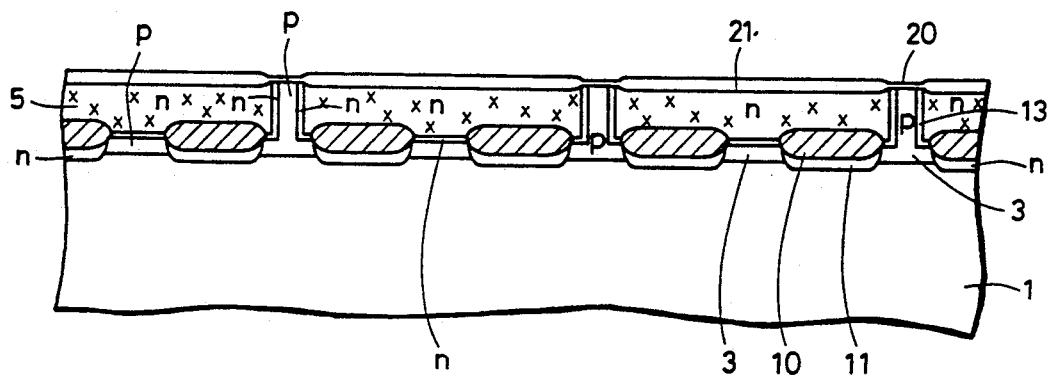

Referring to FIG. 8H, thermal oxidation processing is carried out. At this time, the oxidizing rate of a thermally oxidized film 20 formed on the surface of the monocrystalline silicon layer differs from that of a thermally oxidized film 20 formed on the surface of the polycrystalline silicon layer, so that thermally oxidized film 21 is approximately four times as thick as thermally oxidized film 20. This thermal processing also causes an n-type impurity to be thermally diffused from the polycrystalline silicon layers constituting word lines 5 into the p-type monocrystalline silicon layers constituting bit lines 3, so that gate diffused layers 13 are formed on the sidewall surfaces of columnar layers 12.

Figure 7D:
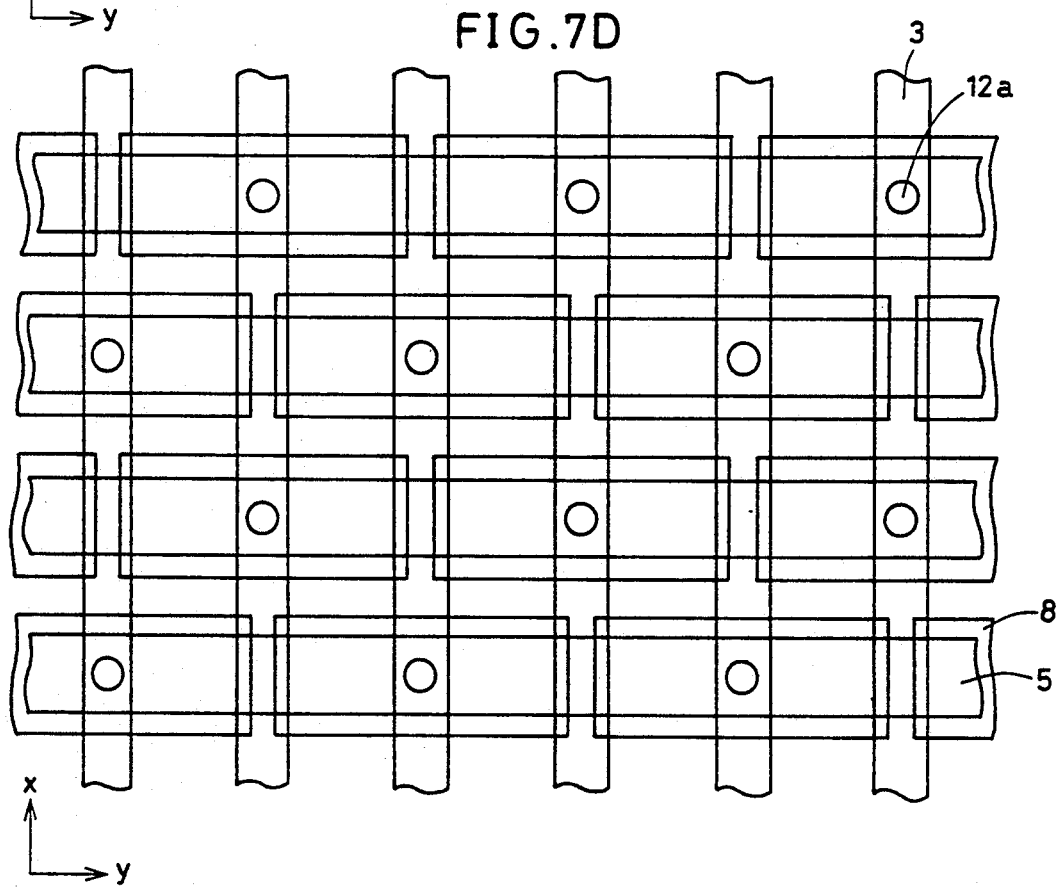
Figure 8I:
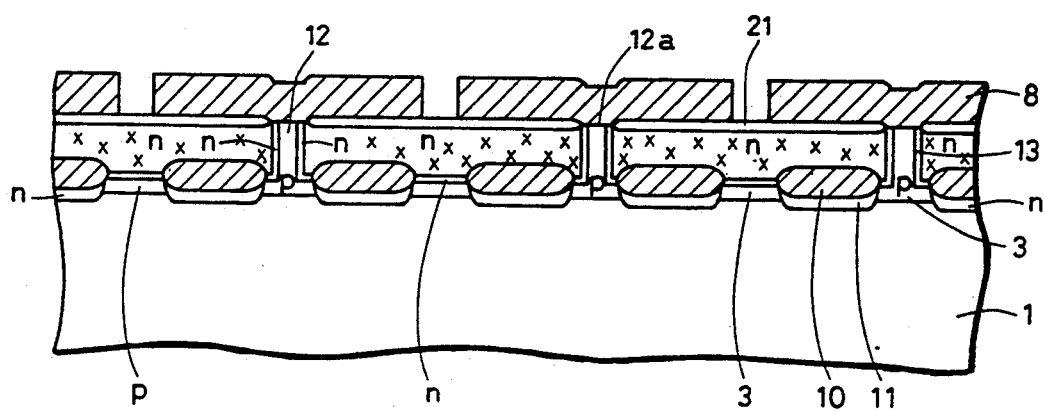

Next, referring to FIG. 8I, only thin silicon oxide films 20 are completely removed by hydrofluoric acid processing. Then, storage nodes 8 comprising polycrystalline silicon are formed in accordance with a prescribed pattern to be electrically in contact with the upper surface 12a of the columnar layer 12. The planar arrangement of storage nodes 8 is illustrated in FIG. 7D.

Figure 8J:
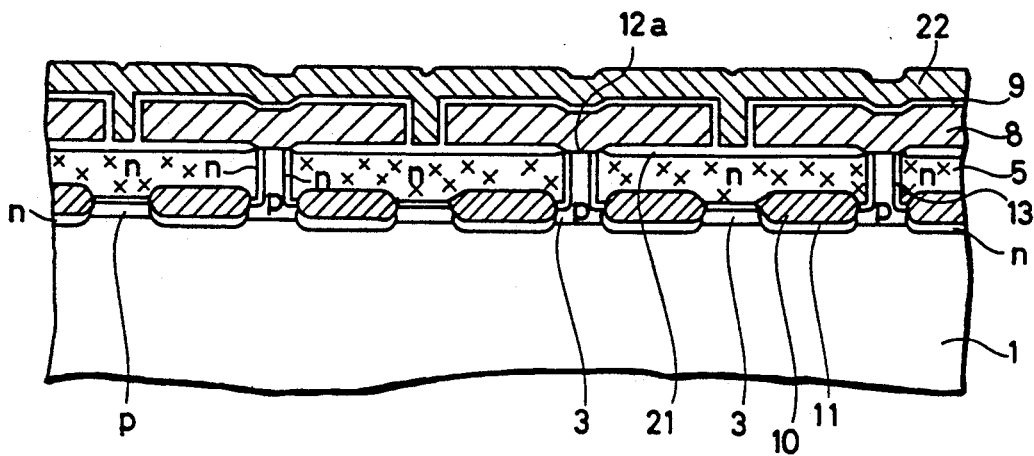

Referring to FIG. 8J, a capacitor dielectric film 9 including a thin silicon oxide film is formed on the surfaces of storage nodes 8 by thermal oxidation processing. Then, cell plate electrode 22 including polycrystalline silicon is formed.

Figure 8K:
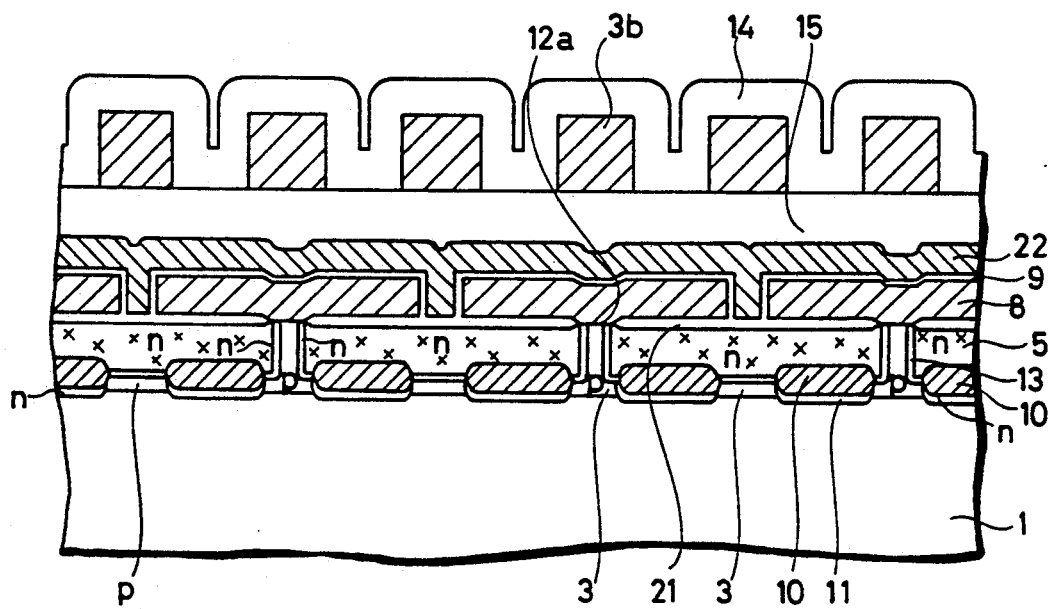

Finally, referring to FIG. 8K, an interlayer insulating film 15 including BPSG is deposited. Bit lines 3b including aluminum interconnection is formed on interlayer insulating film 15 in the peripheral circuit parts to be connected through through-holes to bit line 3. At last, a surface protecting film 14 including a silicon nitride film is formed on the whole surface. Thus, the structure of the semiconductor memory device illustrated in FIG. 3 is completed.

Figure 9:
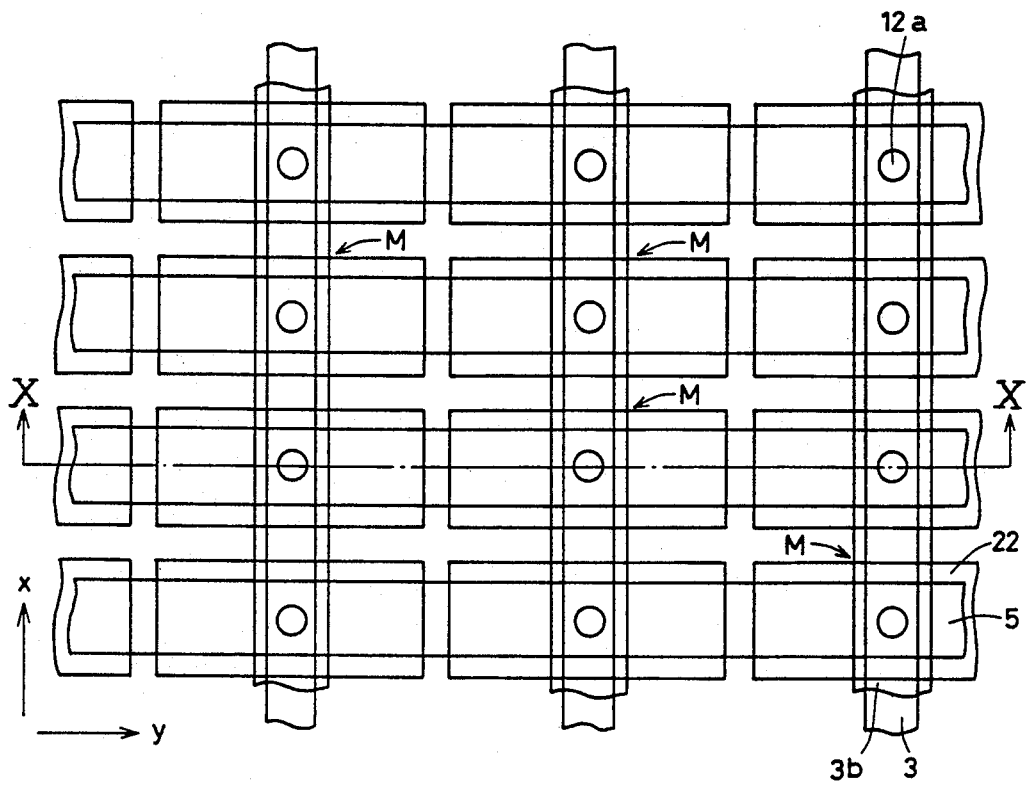
FIG. 9 is a plan view illustrating a planar arrangement according to an open bit line type of a memory cell of the present invention.
Figure 10:
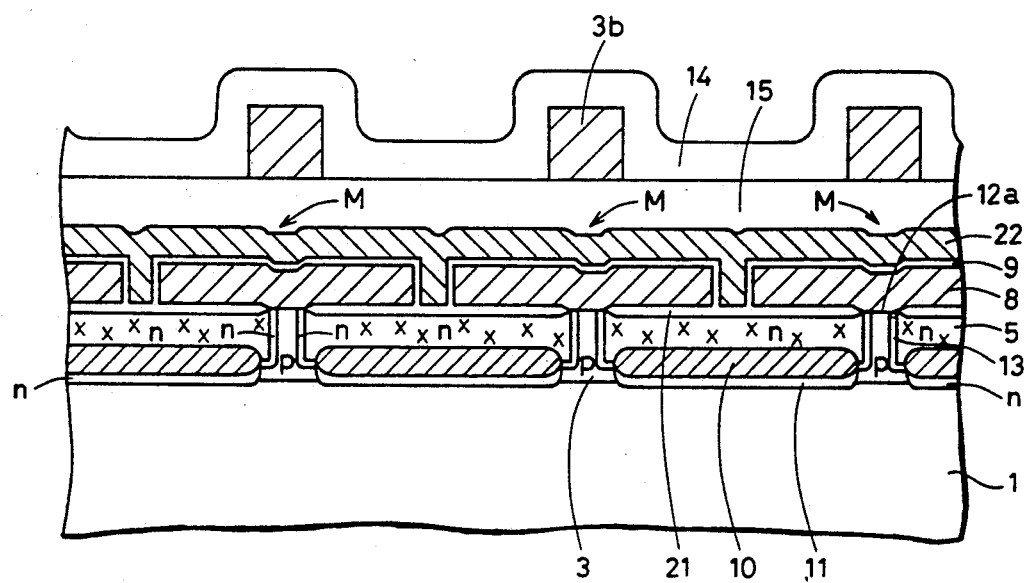
FIG. 10 is a sectional view illustrating a sectional structure taken along line X—X in FIG. 9.
Figure 13:
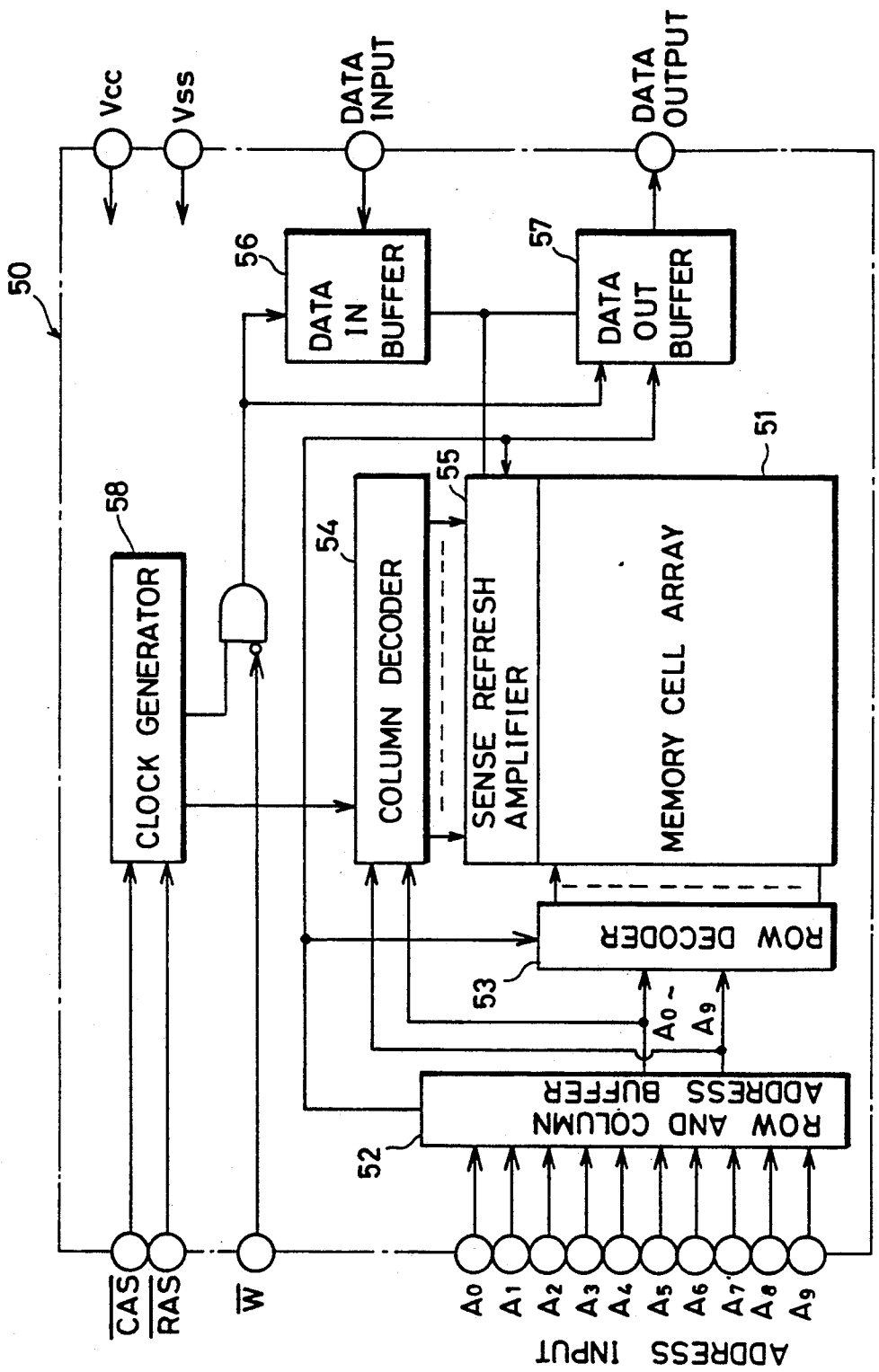
FIG. 13 is a block diagram illustrating the whole structure of a conventional dynamic random access memory (DRAM).
Figure 14:
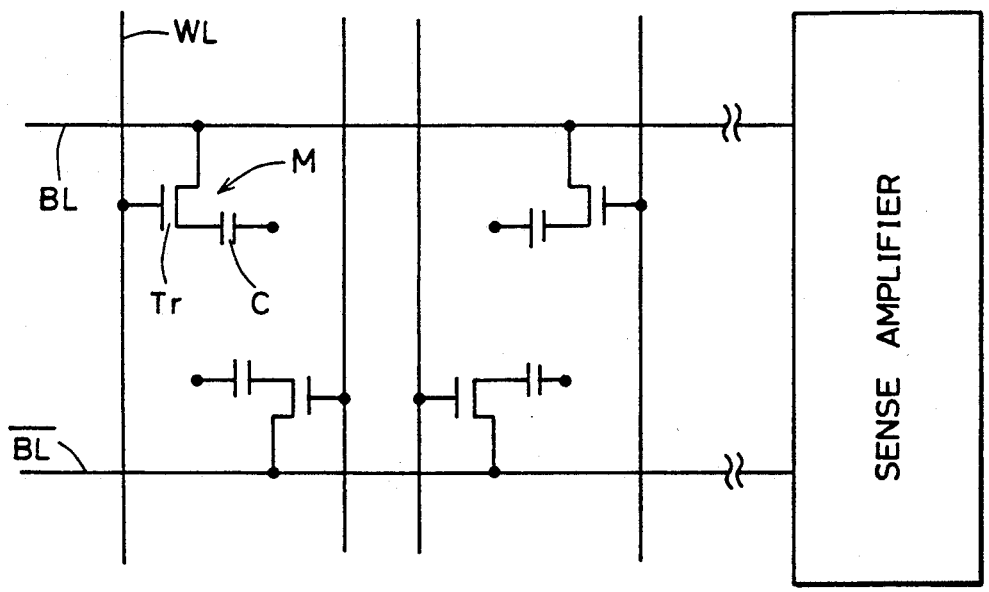
FIG. 14 is an equivalent circuit diagram illustrating a sense amplifier and four bits of memory cells in a memory cell array in the DRAM illustrated in FIG. 13.
Figure 15:
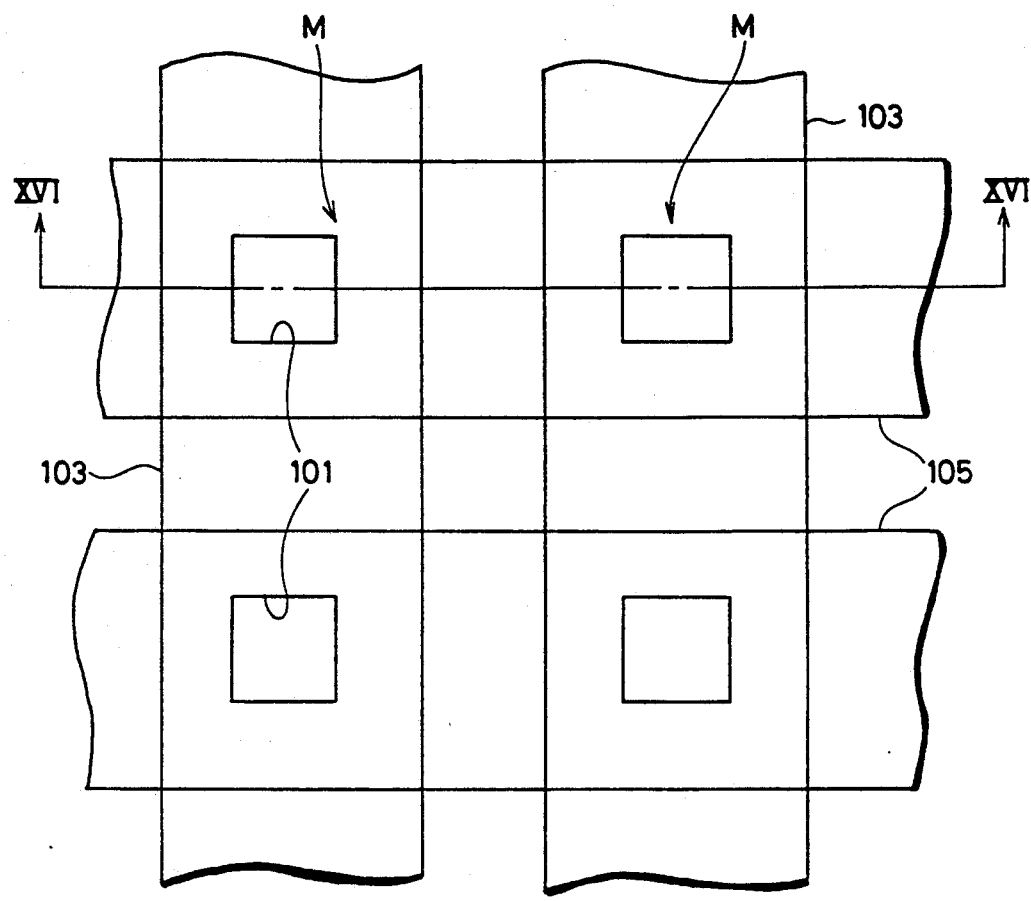
FIG. 15 is a partial plan view illustrating a planar arrangement of miniaturized memory cells in prior art.
Figure 16:
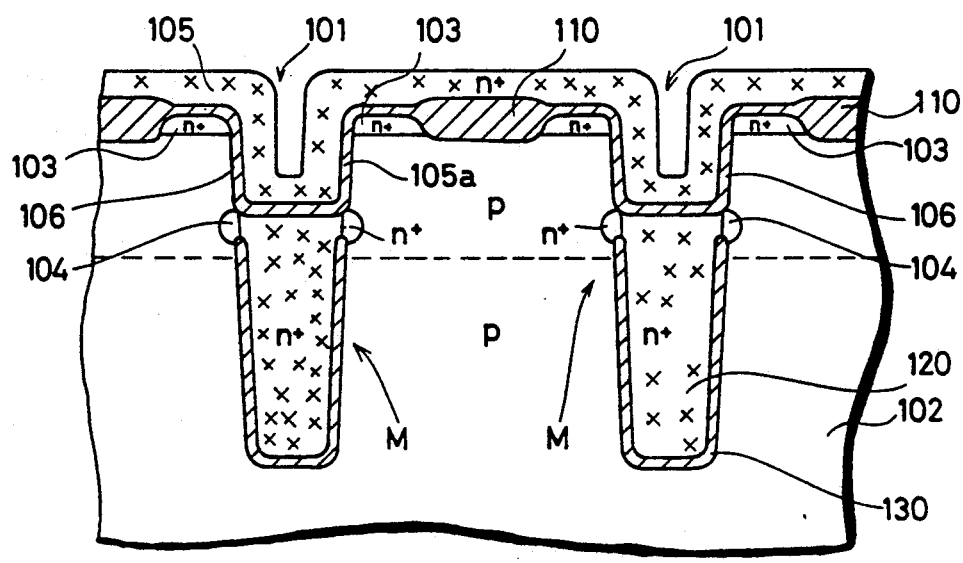
FIG. 16 is a partial sectional view illustrating a sectional structure taken along line XVI—XVI in FIG. 15.

Referring to FIG. 9, memory cells M are arranged at all the crossings of respective bit lines 3 and word lines 5. On the other hand, according to the folded bit line type, memory cells M are arranged at every other crossings of respective bit lines 3 and word lines 5 as illustrated in FIG. 2. Referring to FIG. 10, the sectional structure of the memory cell is the same as that illustrated in FIG. 3.

Figure 11:
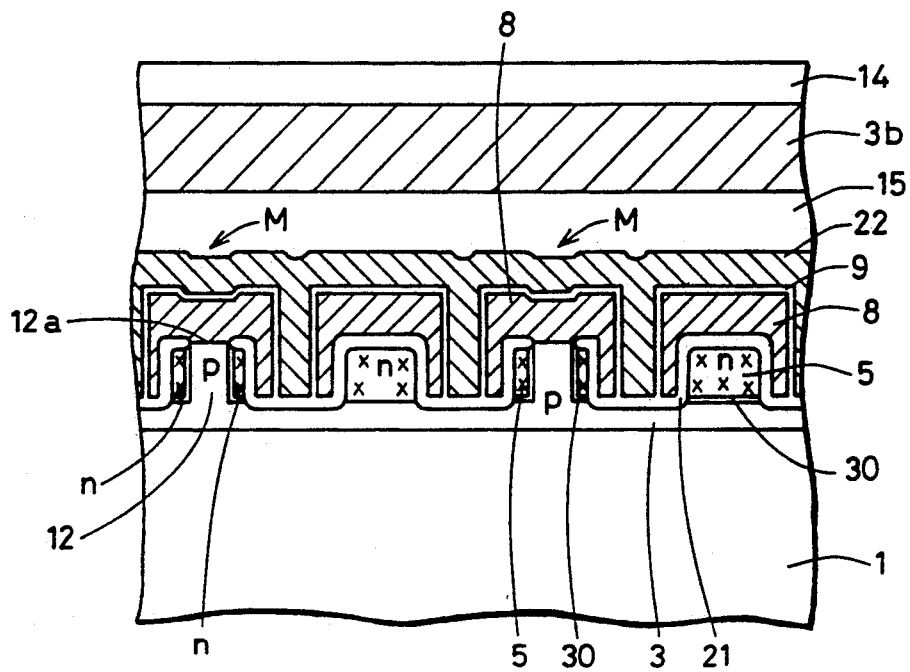
FIG. 11 is a sectional view illustrating a sectional structure according to another embodiment of the present invention using a Schottky gate field effect transistor.
Figure 12:
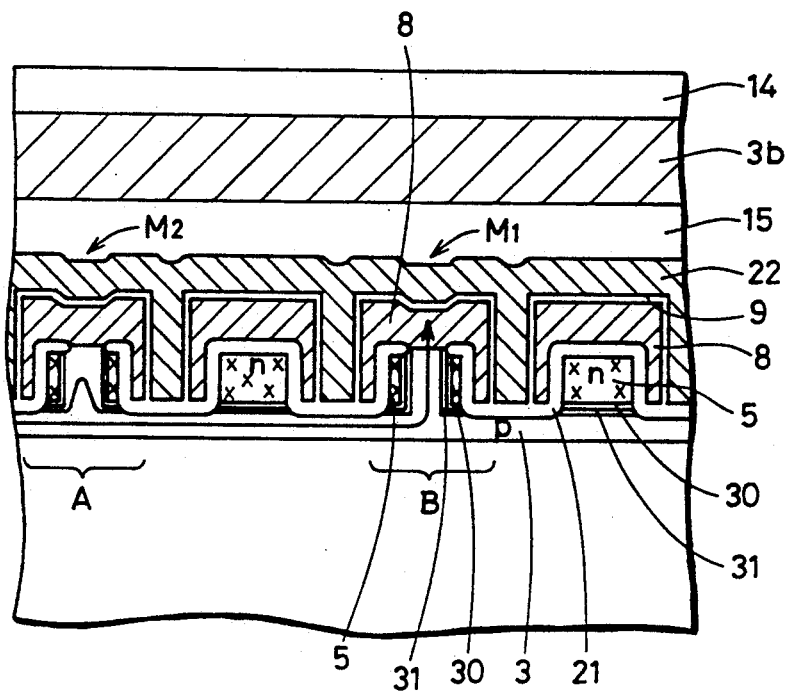
FIG. 12 is a sectional view illustrating operation in another embodiment of a memory cell using a Schottky gate field effect transistor.

FIG. 11 is a sectional view corresponding to the sectional structure in FIG. 4 illustrating another embodiment of a memory cell according to the present invention in the case of using a Schottky gate field effect transistor. FIG. 12 is a sectional view corresponding to FIG. 5 illustrating operation of a memory cell in the case of using a Schottky gate field effect transistor. A Schottky gate field effect transistor is a type of junction field effect transistor in which a Schottky contact brought by contact between a metal and a semiconductor is employed as a gate.

Referring to FIG. 11, the structure is different from the structure in FIG. 4 in that a metal layer 30 including platinum is formed to be electrically in contact with a polycrystalline silicon layer constituting a word line 5 and to be directly in contact with the sidewall of a columnar layer 12 instead of gate diffused layer 13 being formed to be electrically in contact with the polycrystalline silicon layer constituting word line 5. As described above, the switching operation is performed in a Schottky gate field effect transistor in the same way as in the junction field effect transistor in FIG. 4. Referring to FIG. 12, operation which is the same as the writing and reading operation described with reference to FIG. 5 is also performed in a memory cell using a Schottky gate field effect transistor. In the case of the embodiment shown, Schottky contact is made between a metal layer 30 constituting a gate and the sidewall surface of a columnar layer 12 including a p-type monocrystalline silicon layer. Specifically, metal layer 30 including platinum and columnar layer 12 including a p-type monocrystalline silicon layer are formed so that a relationship $\phi_m < \phi_s (\phi_m$: the work function of the metal, $\phi_s$: the work function of the semiconductor (substrate)) is established.

While description has been given of the case where a p channel-type transistor is used as a junction field effect transistor in the above embodiment, an n channel-type transistor may be used.

As described above, according to the present invention, a junction field effect transistor is arranged in a columnar part formed on a semiconductor substrate, so that the length of the gate is controlled by the depth of etching of the semiconductor layer, and variation in the characteristics of the transistor is suppressed. A junction field effect transistor is used, so that the problem of degradation of the characteristics of the transistor caused by hot carriers is solved.

Furthermore, a cell plate electrode is arranged independent of the semiconductor substrate, so that fluctuation in the potential of the cell plate electrode caused by noise of the semiconductor substrate is solved, and it is possible to prevent decrease of the noise margin of a memory cell.

It is possible to apply a potential different from the potential of the substrate to the cell plate electrode, so that the potential of the cell plate can be adjusted to decrease the electric field strength applied to the capacitor dielectric film, and reliability of the memory cell is enhanced.

Accordingly, it is possible to attain higher degree of integration and higher density of a memory cell having enhanced reliability without causing variation in the characteristics of the transistor and decreasing the noise margin of the memory cell.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising a junction field effect transistor and a capacitor, comprising:

a semiconductor substrate having a main surface;

a semiconductor layer of a first conductivity type material formed on the main surface of said semiconductor substrate and including a columnar part extending from the main surface of said semiconductor substrate and having a top surface and a sidewall surface;

said junction field effect transistor formed in said columnar part; and said capacitor formed on the top surface of said columnar part;

said junction field effect transistor including:

a conductive layer formed on the sidewall surface of said columnar part; and a gate electrode formed to be electrically in contact with said conductive layer;

said capacitor including:

a first electrode formed to be electrically in contact with the top surface of said columnar part;

a dielectric film formed on said first electrode; and a second electrode formed on said dielectric film, wherein said gate electrodes includes an impurity region of a second conductivity-type opposite the first conductivity-type and covering the entire sidewall surface of said columnar part.

2. The semiconductor memory device according to claim 1, wherein said gate electrode is formed of a polycrystalline silicon layer including impurity of a second conductivity-type.

3. The semiconductor memory device according to claim 1, wherein said conductive layer includes a second conductivity-type impurity region formed on the sidewall surface of said columnar part.

4. The semiconductor memory device according to claim 1, wherein said conductive layer includes a metal layer formed to be in contact with the sidewall surface of said columnar part and cover said sidewall surface.

5. The semiconductor memory device according to claim 1, wherein said first conductivity-type semiconductor layer is electrically isolated by an isolation oxide film formed on said semiconductor substrate.

6. The semiconductor memory device according to claim 5 further comprising an inversion preventing layer formed beneath said isolation oxide film.

7. The semiconductor memory device according to claim 1, wherein said first electrode includes a conductive layer formed on the top surface of said columnar part on said gate electrode to be, insulated.

8. A method of manufacturing a semiconductor memory device comprising a junction field effect transistor and a capacitor comprising the steps of:

forming on a main surface of a semiconductor substrate a semiconductor layer of a first conductivity-type material and including a columnar part extending from the main surface of said semiconductor substrate and having a top surface and sidewall surface;

forming a conductive layer on the sidewall surface of said columnar part;

forming a gate electrode to be electrically in contact with said conductive layer; and having an impurity region of a second conductivity-type opposite the first conductivity-type and covering the entire sidewall surface of said columnar part;

forming a first electrode to be electrically in contact with the top surface of said columnar part;

forming a dielectric film on said first electrode; and forming a second electrode on said dielectric film.

9. The method of manufacturing a semiconductor memory device according to claim 8, wherein said step of forming a first conductivity-type semiconductor layer includes the steps of:

forming a first conductivity-type semiconductor layer on the whole of the main surface of said semiconductor substrate; and forming said columnar part in a convex shape by selectively removing said semiconductor layer.

10. The method of manufacturing a semiconductor memory device according to claim 8, wherein said step of forming said conductive layer includes the step of forming a second conductivity-type impurity region on the sidewall surface of said columnar part.

11. The method of manufacturing a semiconductor memory device according to claim 10, wherein said step of forming a second conductivity-type impurity region includes the steps of forming a polycrystalline silicon layer including a second conductivity-type impurity region to cover the sidewall surface of said columnar part; and doping said second conductivity-type impurity from said polycrystalline silicon layer to the sidewall surface of said columnar part.

12. The method of manufacturing a semiconductor memory device according to claim 11, wherein said step of forming a gate electrode includes the step of forming said polycrystalline silicon layer.

13. The method of manufacturing a semiconductor memory device according to claim 8, wherein said step of forming a first conductivity-type semiconductor layer comprises the steps of:

forming a first conductivity-type semiconductor layer on the whole of the main surface of said semiconductor substrate; and forming isolation oxide films spaced apart from each other on said semiconductor substrate to electrically isolate said semiconductor layer.

14. A dynamic random access memory comprising a junction field effect transistor and a capacitor, comprising:

a semiconductor substrate having a main surface;

a plurality of bit lines formed in a semiconductor layer of a first conductivity-type material on the main surface of said semiconductor or substrate, electrically isolated from each other, and extending in a first direction;

a plurality of word lines formed on said bit lines and extending in a second direction crossing said first direction; and a plurality of memory cells arranged at the crossings of said word lines and said bit lines;

said bit lines including columnar parts extending from the main surface of said semiconductor substrate at said crossings and each having a top surface and a sidewall surface;

each of said memory cells including said capacitor formed on the top surface of said columnar part and said junction field effect transistor formed in said columnar part;

said junction field effect transistor including:

a conductive layer formed on the sidewall surface of said columnar part; and a gate electrode formed to be electrically in contact with said conductive layer and connected to said work line, said gate electrode including an impurity region of a second conductivity type material opposite the first conductivity-type material and covering the entire sidewall surface of said columnar part;

said capacitor including:

a first electrode formed to be electrically in contact with the top surface of said columnar part;

a dielectric film formed on said first electrode; and a second electrode formed on said dielectric film.

* * * * *